United States Patent
Zhao et al.

[11] Patent Number: 6,157,087
[45] Date of Patent: Dec. 5, 2000

[54] CONSISTENT ALIGNMENT MARK PROFILES ON SEMICONDUCTOR WAFERS USING METAL ORGANIC CHEMICAL VAPOR DEPOSITION TITANIUM NITRIDE PROTECTIVE LAYER

[75] Inventors: Joe W. Zhao; Shumay X. Dou; Keith K. Chao, all of San Jose, Calif.

[73] Assignee: LSI Logic Corporation, Milpitas, Calif.

[21] Appl. No.: 09/289,828

[22] Filed: Apr. 12, 1999

Related U.S. Application Data

[62] Division of application No. 08/925,200, Sep. 8, 1997, Pat. No. 6,060,787, which is a division of application No. 08/924,903, Sep. 8, 1997, Pat. No. 5,981,352.

[51] Int. Cl.[7] .................................................. H01L 23/544
[52] U.S. Cl. .......................... 257/797; 257/915; 438/401; 438/975
[58] Field of Search ..................................... 257/797, 915, 257/763, 751, 767; 438/401, 462, 975

[56] References Cited

U.S. PATENT DOCUMENTS

| 5,002,902 | 3/1991  | Watanabe        | 438/401  |
|-----------|---------|-----------------|----------|
| 5,064,683 | 11/1991 | Poon et al.     | 427/569  |
| 5,089,438 | 2/1992  | Katz            | 438/558  |
| 5,270,255 | 12/1993 | Wong            | 438/643  |
| 5,312,512 | 5/1994  | Allman et al.   | 438/624  |
| 5,329,334 | 7/1994  | Yim et al.      | 355/53   |
| 5,464,031 | 11/1995 | Buley et al.    | 143/1    |
| 5,503,962 | 4/1996  | Caldwell        | 430/317  |
| 5,532,520 | 7/1996  | Haraguchi et al.| 257/797  |
| 5,554,561 | 9/1996  | Plumton         | 438/193  |
| 5,563,090 | 10/1996 | Lee et al.      | 438/398  |
| 5,612,558 | 3/1997  | Harshfield      | 257/298  |
| 5,618,381 | 4/1997  | Doan et al.     | 438/633  |
| 5,627,624 | 5/1997  | Yim et al.      | 355/53   |
| 5,672,385 | 9/1997  | Jimba et al.    | 427/248.1|
| 5,686,761 | 11/1997 | Huang et al.    | 257/753  |
| 5,700,383 | 12/1997 | Feller et al.   | 438/645  |
| 5,701,013 | 12/1997 | Hsia et al.     | 250/491.1|
| 5,702,981 | 12/1997 | Maniar et al.   | 438/627  |
| 5,705,080 | 1/1998  | Leung et al.    | 438/680  |
| 5,717,250 | 2/1998  | Schuele et al.  | 257/754  |
| 5,872,042 | 2/1999  | Hsu et al.      | 438/401  |

OTHER PUBLICATIONS

Unknown Author, "Thermal Oxidation of Single Crystal Silicon", p. 7, place of publication unknown, date of publication unknown.

Wolf et al., "*Silicon Processing for the VLSI Era vol. 1–Process Technology,*" p. 198, Lattice Press, 1986.

*Primary Examiner*—Donald L. Monin, Jr.
*Assistant Examiner*—Hoai Pham
*Attorney, Agent, or Firm*—Beyer, Weaver & Thomas, LLP

[57] ABSTRACT

Provided is a method and composition for protecting alignment mark trench walls from attack by CMP slurry accumulating in an alignment mark trench during CMP processing. In a preferred embodiment, a metal organic chemical vapor deposition titanium nitride (MOCVDTiN) layer is deposited over a conventionally applied bulk tungsten layer prior to commencing CMP operations. This MOCVDTiN layer is resistant to CMP slurry attack. As a result, the tungsten trench profile remains a consistent and reliable alignment mark.

5 Claims, 4 Drawing Sheets

CONSISTENT ALIGNMENT MARK PROFILES ON SEMICONDUCTOR WAFERS USING METAL ORGANIC CHEMICAL VAPOR DEPOSITION TITANIUM NITRIDE PROTECTIVE LAYER

This is a Divisional of application Ser. No. 08/925,200 filed on Sep. 8, 1997, now U.S. Pat. No. 6,060,787, which is the Divisional of application Ser. No. 08/924,903 filed on Sep. 8, 1997, now U.S. Pat. No. 5,981,352.

BACKGROUND OF THE INVENTION

The present invention relates to the formation of alignment marks for photolithographic masks in semiconductor wafer fabrication. More particularly, the present invention relates to alignment marks including a metal organic chemical vapor deposition titanium nitride protective layer over an alignment trench in the surface of a semiconductor wafer.

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Layers are typically either grown (for example, thermal oxidation of silicon to grow a silicon dioxide insulation layer) or deposited by a variety of techniques such as chemical vapor deposition (CVD) and physical vapor deposition (PVD), including evaporation and sputtering. Patterning is an operation that is used to remove specific portions of the top layer or layers on the wafer surface. Patterning is usually accomplished through the use of photolithography (also known as photomasking) to transfer the semiconductor design to the wafer surface.

The objective of the photolithographic process is to create in or on the wafer surface the various parts of a device or circuit in the exact dimensions specified by the circuit design ("resolution"), and to locate them in their proper location on the wafer surface ("alignment"). In order for the finished circuit to function properly, the entire circuit pattern circuit must be correctly placed on the wafer surface, and the individual parts of the circuit must be in the correct positions relative to each other. Since the final wafer pattern is generated from several photomasks applied to the wafer sequentially, misalignment of even a single mask layer can cause the entire circuit to fail.

In order to provide proper alignment of mask layers, photolithography tools are equipped to locate certain alignment marks on preceding layers. The alignment of two features on successive layers is straight forward. However, when, as is frequently the case, two features on non-successive layers require alignment, the location of the alignment marks through an intervening layer is more complicated. In many instances during fabrication, the preceding layer is transparent or translucent, allowing alignment marks on an underlying wafer to be optically detected by techniques well known in the art, such as bright field or dark field alignment. For example, a metal layer is typically covered by an oxide insulating layer. A photolithography stepper using bright field alignment will be able to locate the metal lines in the metal layer, to which contact holes must be aligned, through the transparent oxide layer. The stepper may then properly align the mask for the via holes.

However, in some cases alignment of non-successive layers in which the intervening layer is opaque is required. This is the case with metal layer alignment, where it may be necessary to align a mask to a mark on a layer that is covered with an opaque metal layer. Alignment in such cases has been achieved by providing some topography in, for example, the underlying the metal layer. An example of this technique is illustrated in FIGS. 1A through 1D.

FIG. 1A shows a cross-section of a portion of a semiconductor wafer 101 during fabrication having a trench 100 etched in a surface layer 102 to provide a mold for an alignment mark. The alignment mark trench is typically adjacent to a die on the semiconductor wafer, and each die typically has several alignment marks associated with it. In a preferred embodiment, the surface layer 102 is a dielectric layer, such as an oxide, nitride, polymer, or composite of these, and will generally be referred to as such in this application.

The mark is typically formed by deposition of tungsten 104 by CVD in the mold trench 100. Conventional tungsten deposition is typically preceded by deposition of a thin layer of PVD or CVD titanium nitride (TiN) as a glue layer (not shown) for the subsequently deposited tungsten. The deposition typically has two phases. First a relatively thin nucleation layer 103 of tungsten with fine grain size and conformity having an equiaxed grain structure is deposited over the oxide 102 and glue layer. This nucleation layer 103 provides a good base on the substrate material for subsequent bulk deposition of tungsten. The bulk tungsten 105, which is typically used to form the main body of the alignment mark due to its high deposition rate, has a columnar grain structure with uneven grain size and distribution and variable defect density relative to the nucleation layer 103. Since the CVD tungsten is conformal, a deposition trench 106, which follows the contours of the mold trench 100, remains in the surface of the wafer 108 following tungsten deposition. This deposition trench 106 ultimately serves as an alignment mark.

FIG. 1B shows the same wafer portion cross-section as in FIG. 1A following planarization of the wafer surface 108 according to an etch back technique well known in the art. The tungsten layer 104 above the level of the oxide has been removed, and the deposition trench 106 in the wafer surface is maintained by removal of tungsten in the mold trench 100 by the etch back. FIG. 1C shows the portion of the wafer 101 following deposition of a metal layer 110, typically AlCu, by PVD. While the PVD deposition is directional rather than conformal, it does deposit the metal layer 110 in a predictable manner so that the topographical pattern produced by the deposition trench 106 is reproducible.

As shown in FIG. 1D, metal deposition is followed by application of a conformal photoresist layer 112 which is subsequently patterned for the next layer (not shown). The result of this process is that the deposition trench 106 is maintained in a reproducible manner, providing a reliable alignment mark for the stepper when patterning the photoresist layer 112. The alignment mark is detectable, due to the topography it produces in the wafer surface, and provides detection accuracy, since the intervening process steps maintain the topography in a reproducible manner.

While the adoption of chemical mechanical polishing (CMP) of wafer surfaces during fabrication produced improved planarization results over etch back techniques, it has presented further problems for mask alignment. For example, as illustrated in FIG. 2A, a trench 200 is etched in an oxide layer 202 at the surface of a wafer 204 to serve as a mold for an alignment mark. A tungsten layer 206 is conformally deposited over the wafer surface 208 by CVD.

As described above, a conventional tungsten layer is composed of a thin nucleation layer 205 deposited over the oxide 202, and bulk tungsten layer 207 over the nucleation layer 205. The CVD tungsten is conformal and forms a deposition trench 210 following the contours of the mold trench 200, with the bulk tungsten forming the walls 212 of the deposition trench.

As illustrated in FIG. 2B, as the wafer surface 208 is planarized by CMP, slurry (not shown) accumulates in the deposition trench 210. Since the polishing pad (not shown) does not contact the deposition trench walls 212 to polish them or remove the slurry, the walls 212 of the trench 210 are attacked by the oxidizing slurry. Due to the irregular structure of the bulk tungsten, discussed above, from which they are formed, the walls 212 are rendered uneven in an unpredictable way by the CMP slurry attack. As a result, the profile of the deposition trench 210 following CMP may be asymmetric and non-reproducible, as shown in FIG. 2B. This, in turn, results in an asymmetric and non-reproducible topography in the wafer surface 208 following deposition of the metal layer 214 and photoresist 216, illustrated in FIGS. 2C and 2D, respectively. Therefore, while the deposition trench alignment mark 210 may be detectable due to, its topography, its detection accuracy is unreliable due to its unpredictable deformation by the CMP slurry.

Accordingly, what is needed are methods and compositions for obtaining consistent alignment mark profiles with both detectability and detection accuracy for use in conjunction with CMP processes during semiconductor fabrication.

SUMMARY OF THE INVENTION

To achieve the foregoing, the present invention provides a method and composition for reducing the rate of, and rendering more uniform the oxidation of alignment mark deposition trench walls by CMP slurry accumulating in an alignment mark trench during CMP processing. In a preferred embodiment, a protective layer of metal organic chemical vapor deposition TiN (MOCVDTiN) layer is deposited over a conventionally applied bulk tungsten layer prior to commencing CMP operations. The MOCVDTiN is substantially resistant to CMP slurry attack. As a result, the alignment mark deposition trench profile remains a consistent and reliable alignment mark. In an alternative embodiment, the MOCVDTiN layer is deposited over the bulk tungsten layer following CMP operations in order to repair damage caused by slurry attack.

A pre-CMP tungsten layer according to a preferred embodiment of the present invention includes an initial nucleation layer of tungsten, which provides a base for an intermediate bulk tungsten layer, which is in turn covered with a MOCVDTiN layer to provide protection during CMP processing, or to repair damage caused during CMP processing.

The invention provides an alignment mark on a semiconductor wafer. The alignment mark is composed of a trench in a surface of a metallic region in the semiconductor wafer, and a protective layer of metal organic chemical vapor deposition titanium nitride forming the surface walls of the trench. The metallic region is preferably composed of tungsten. The protective layer is preferably between about 50 and 300 Å thick.

The invention further provides an alignment mark on a semiconductor wafer formed from a trench in a dielectric layer of a semiconductor wafer and several additional layers: A base nucleation layer of conformally deposited equiaxed grain tungsten lining the trench, a bulk layer of conformally deposited columnar grain tungsten covering the base layer, and a protective layer of conformally deposited metal organic chemical vapor deposition titanium nitride covering the bulk layer.

A deposition trench providing a reliable alignment mark is formed by the metal and titanium nitride layers following planarization of the wafer's surface by chemical mechanical polishing. An alignment mark according to the present invention may also include a metal layer and a photoresist layer deposited following chemical mechanical polishing of the wafer's surface, so that a deposition trench providing a reliable alignment mark is formed by the tungsten, titanium nitride, metal and photoresist layers.

In addition, the invention provides a method of forming an alignment mark on a semiconductor wafer. The method involves providing a semiconductor wafer having a trench in its surface layer, depositing a layer of metal in the trench, and depositing a protective layer of metal organic chemical vapor deposition titanium nitride over the metal layer. The metal layer is preferably composed of tungsten.

The invention also provides a method of forming an alignment mark on a semiconductor wafer, involving providing a semiconductor wafer having a trench in its surface dielectric layer and depositing several additional layers. A base layer of equiaxed grain tungsten is deposited over the trench. Next a bulk layer of columnar grain tungsten is deposited over the base layer. Then a protective layer of metal organic chemical vapor deposition titanium nitride is deposited over the bulk layer.

The methods may also include planarizing the wafer surface by chemical mechanical polishing, depositing a metal layer on the polished surface, depositing a photoresist layer on the metal layer, and patterning the photoresist. Further, the wafer surface may planarized prior to depositing the metal organic chemical vapor deposition titanium nitride layer.

These and other features and advantages of the present invention are described below with reference to the drawings.

DETAILED DESCRIPTION OF THE PREFERRED EMBODIMENTS

The present invention provides a method and composition for obtaining consistent alignment mark profiles with both detectibiliy and detection accuracy for use in conjunction with CMP planarization processes in semiconductor fabrication. The method and composition reduce the rate of and increase the uniformity of oxidation of alignment mark trench side walls by CMP slurry accumulating in an alignment mark trench during CMP processing. In a preferred embodiment, a protective layer of MOCVDTiN is deposited over a conventionally applied bulk tungsten layer to provide protection during CMP processing, or to repair damage caused during CMP processing. As a result, the tungsten trench profile remains a consistent and reliable alignment through CMP processing.

In the following description, numerous specific details are set forth in order to fully illustrate preferred embodiments of the present invention. It will be apparent, however, that the present invention may be practiced without limitation to some specific details presented herein. For example, the base metal deposited in the surface layer trench of the wafer to form the alignment mark may be a metal other than tungsten. For example, any metal which may be reliably deposited in a conformal manner may be used. Preferred metals will have a resistivity of no more than about 12$\Omega$-cm. Such metals will also typically be subject to CMP slurry attack.

FIGS. 3A through 3D show various stages in the in the creation of a topographical alignment mark for use with CMP processing, according to a preferred embodiment of the present invention. As in the previous figures, in order to more clearly identify important features of the present invention, only a portion of the semiconductor wafer is shown. Also, the drawings are intended to be representative and are not necessarily to scale.

Figure 1A:
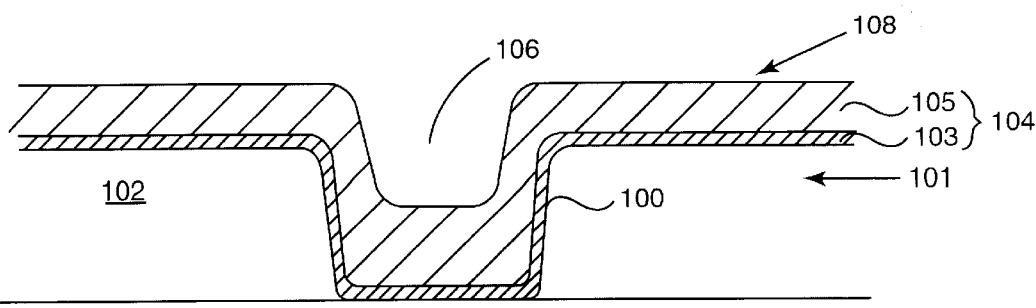
FIGS. 1A–D depict cross-sectional views of a portion of a semiconductor wafer showing various stages in the creation of a topographical alignment mark used with etch back planarization processing.
Figure 1B:
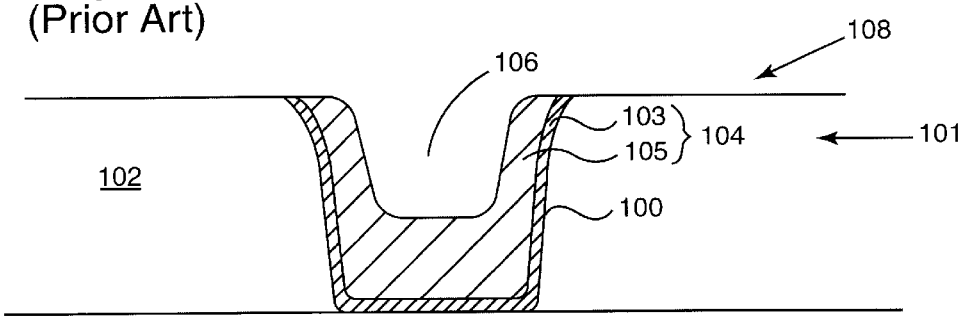
Figure 1C:
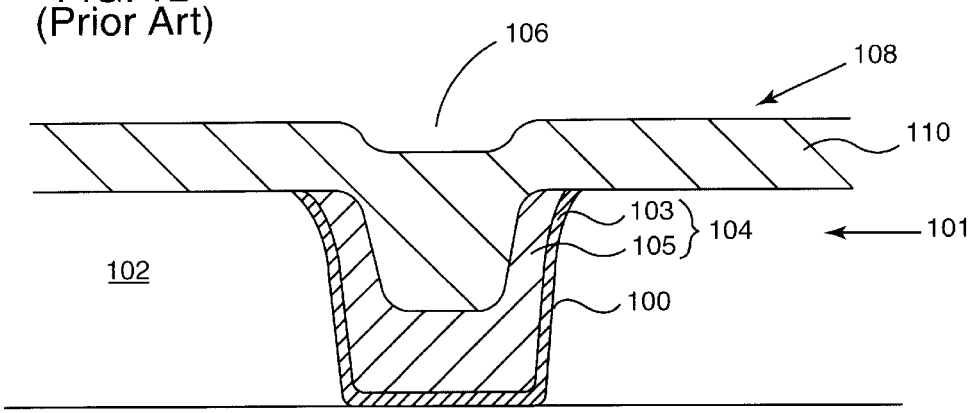
Figure 1D:
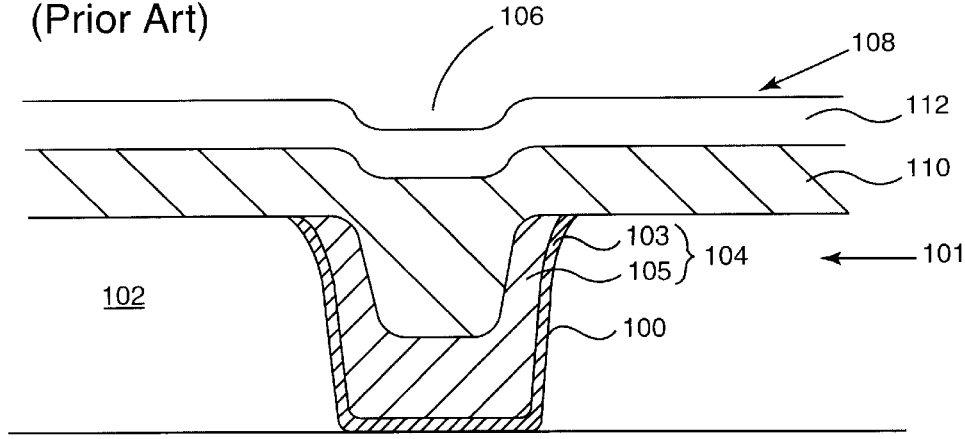
Figure 2A:
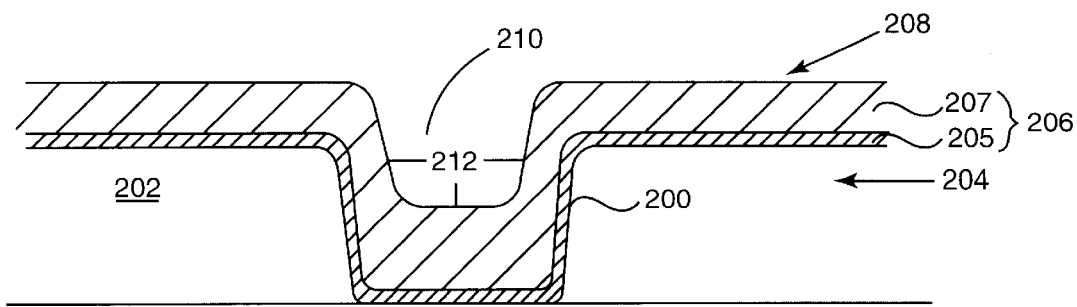
FIGS. 2A–D depict cross-sectional views of a portion of a semiconductor wafer showing various stages in the creation of a topographical alignment mark used with conventional CMP processing.
Figure 2B:
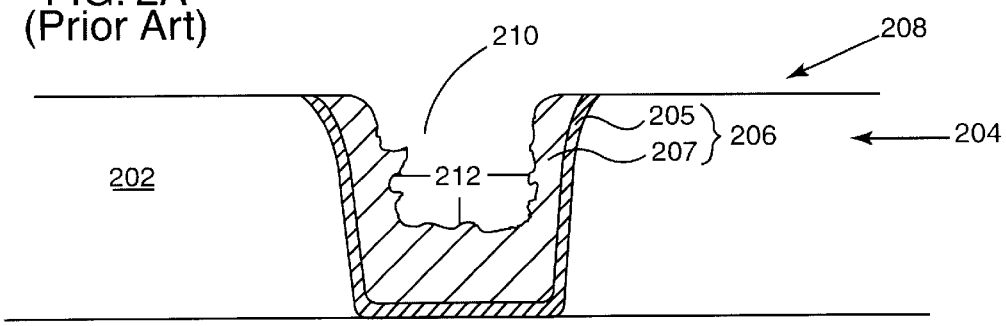
Figure 2C:
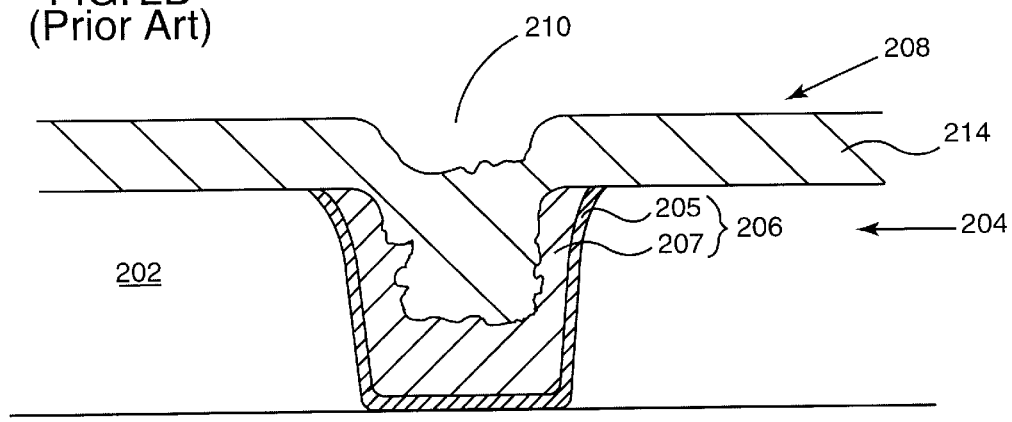
Figure 2D:
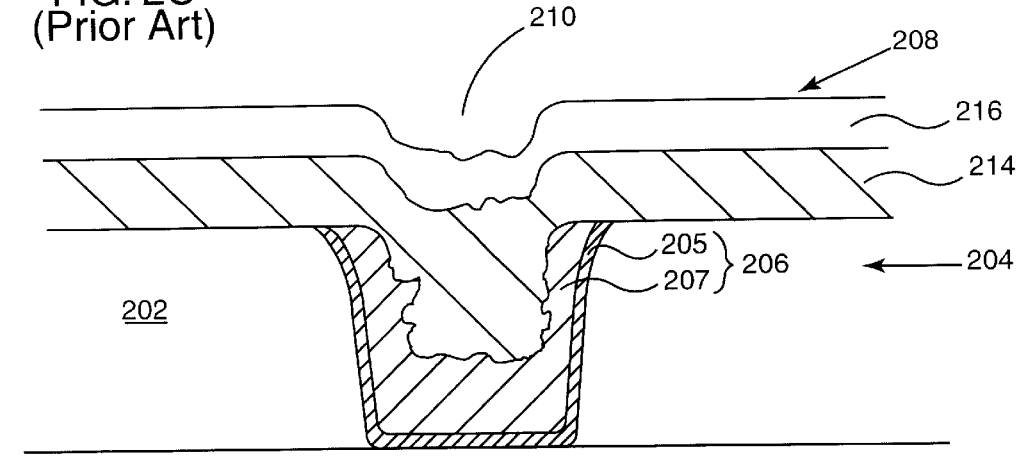
Figure 3A:
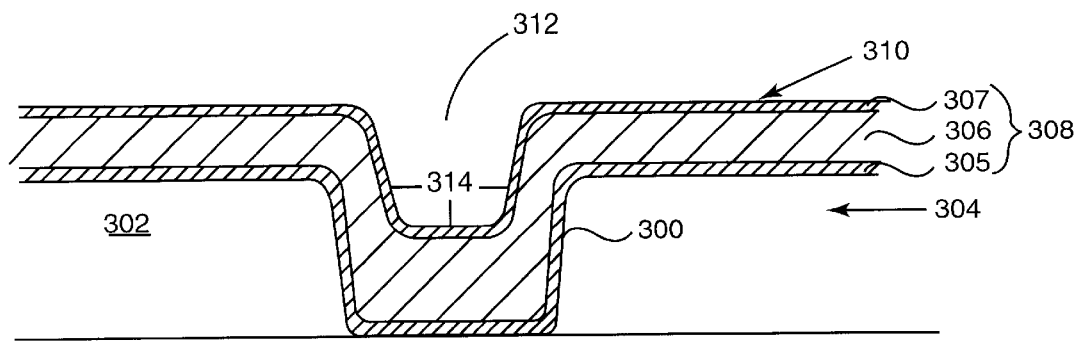
FIGS. 3A–D depict cross-sectional views of a portion of a semiconductor wafer showing various stages in the creation of a topographical alignment mark for use with CMP processing, according to a preferred embodiment of the present invention.

In FIG. 3A, a trench 300 is provided in a dielectric layer 302 at the surface of a wafer 304, preferably adjacent to a die, to serve as a mold for an alignment mark. The trench may have conventional dimensions, well known in the art, for an alignment mark trench. In a preferred embodiment, described below, the alignment mark is composed of tungsten. As noted above, other appropriate metals, for instance those which may be reliably deposited in a conformal manner may be used. Preferred metals will have a resistivity of no more than about 12$\Omega$-cm, for example, aluminum and copper.

A tungsten layer 308 may be conformally deposited over the wafer surface 310 by CVD. As described above, a conventional tungsten layer is composed of a thin nucleation layer 305 of equiaxed grain tungsten, about 200 to 1000 Å thick deposited over the dielectric 302, and a bulk columnar grain tungsten layer 306, about 2000 to 8000 Å thick over the nucleation layer 305. A TiN glue layer also typically precedes the tungsten nucleation layer. As described above, the bulk tungsten layer 306, which is conventionally the top-most tungsten layer, has a columnar structure with uneven grain size and distribution and variable defect density relative to the nucleation layer 305.

The bulk tungsten layer 306 may be deposited using conventional chemical vapor deposition parameters well known in the art, for example, a tungsten hexafluoride (WF$_6$) flow rate of preferably about 1 to 400 standard cubic centimeters per minute (sccm), more preferably about 50 to 100 sccm, and most preferably about 75 sccm; a hydrogen (H$_2$) flow rate of preferably about 2 to 2000 sccm, more preferably about 500 to 1000 sccm, and most preferably about 500 sccm; a pressure of preferably about 1 to 200 Torr, more preferably about 30 to 100 Torr, and most preferably about 40 to 90 Torr; and a temperature of preferably about 350 to 500° C., more preferably about 350 to 450° C., and most preferably about 400 °C.

In addition to these two conventional tungsten layers 305 and 306, this embodiment of the present invention provides a third protective layer 307 composed of metal organic chemical vapor deposition TiN (MOCVDTiN) over the bulk layer 306. This protective MOCVDTiN layer is substantially resistant to attack from CMP slurry accumulating in the deposition trench 312 during CMP. The protective layer 307 is thick enough to withstand attack by CMP slurry during CMP processing of the wafer. For example, the protective layer 307 is preferably about 50 to 300 Å thick, more preferably about 50 to 250 Å thick, and most preferably about 150 Å thick.

The deposition may be conducted using conventional deposition parameters well known in the art, for example, a tetrakis (diethylamino titanium) (TDEAT; Ti((CH$_3$CH$_2$)$_2$N)$_4$) flow rate of preferably about 0.1 to 10 sccm, more preferably about 0.5 to 5 sccm, and most preferably about 3 sccm; an ammonia (NH$_3$) flow rate of preferably about 1000 to 20,000 sccm, more preferably about 5000 to 15,000 sccm, and most preferably about 12,000 sccm; a pressure of preferably about 1 to 60 Torr, more preferably about 5 to 50 Torr, and most preferably about 40 Torr; and a temperature of preferably about 200 to 450 ° C., more preferably about 280 to 380 ° C., and most preferably about 300 ° C.

The protective layer may also be composed of other metal nitrides, or of fine equiaxed grain tungsten (such as described in U.S. patent application Ser. No. 08/924,903 (Attorney Docket No. LSI1P105) entitled CONSISTENT ALIGNMENT MARK PROFILES ON SEMICONDUCTOR WAFERS USING FINE GRAIN TUNGSTEN PROTECTIVE LAYER, filed concurrently herewith) deposited on the surface of the bulk tungsten layer.

As with the conventional tungsten layers, MOCVDTiN deposition is substantially conformal. Therefore, a deposition trench 312, which follows the contours of the original alignment mark trench 300, remains in the surface of the wafer 310 following tungsten deposition. However, whereas, conventionally, the walls of the deposition trench are formed from bulk tungsten, in this embodiment of the present invention the walls 314 are formed from the protective MOCVDTiN layer 307 which covers the bulk layer 306. As in the conventional case, the deposition trench 312 ultimately serves as an alignment mark. However, the properties of this MOCVDTiN layer 307 make it substantially resistant to slurry attack. As a result, the deposition trench 312 remains a consistent and reliable alignment mark.

Figure 3B:
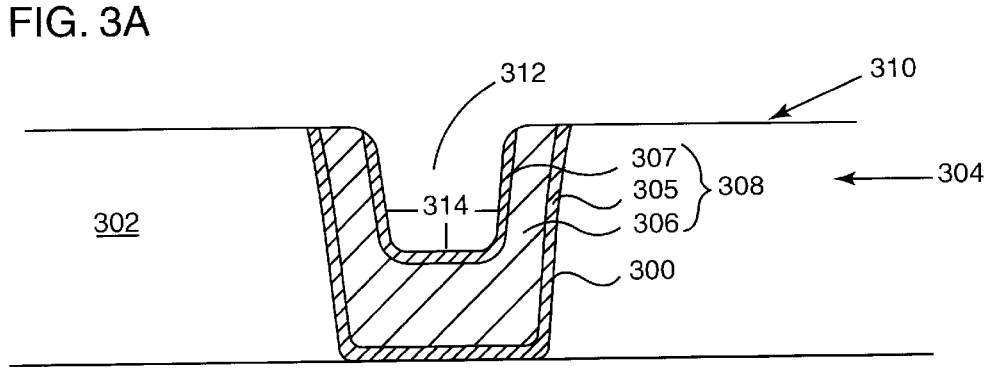
Figure 3C:
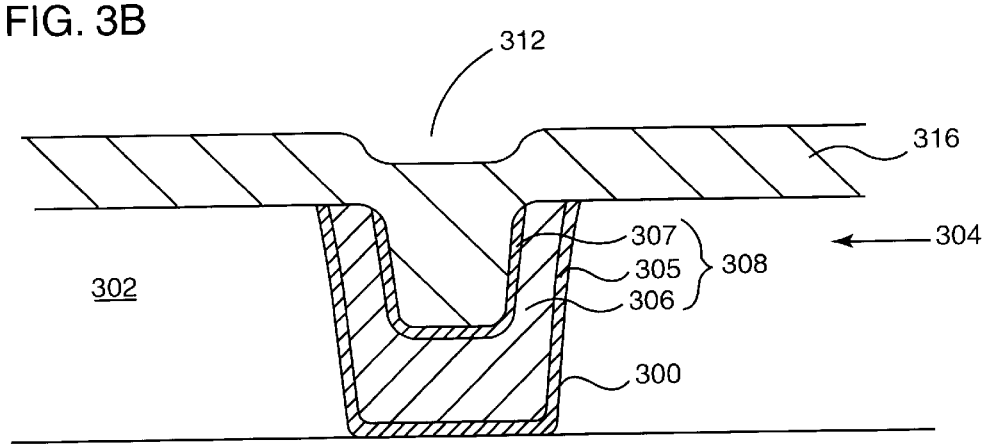
Figure 3D:
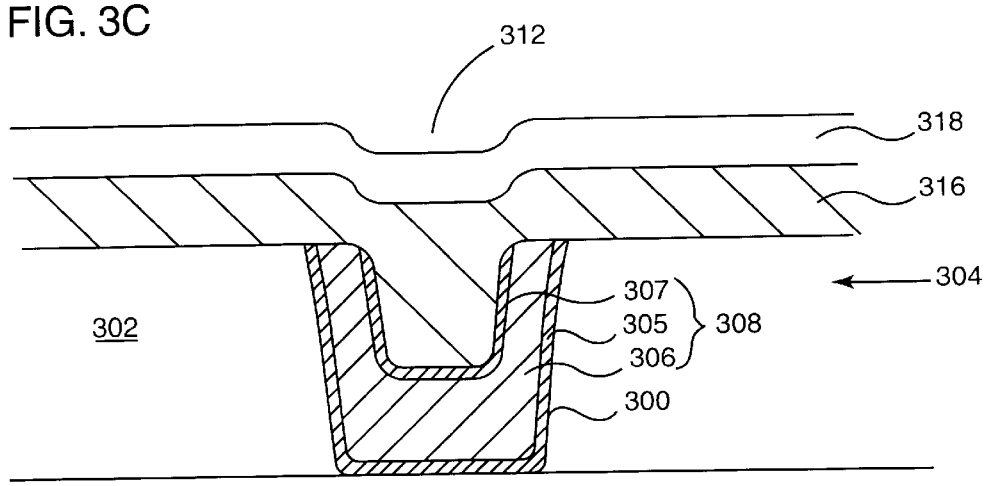

FIGS. 3B through 3D illustrate various remaining stages in the creation of the alignment mark. As illustrated in FIG. 3B, the wafer surface 310 is planarized by CMP. Slurry accumulation (not shown) in the deposition trench does not substantially deteriorate the trench walls 314 due to the slurry-resistant character of the protective layer 307, described above. As a result, during CMP the deposition trench 312 substantially retains its symmetric profile. This, in turn, results in a substantially symmetric and reproducible topography in the wafer surface 312 following metal deposition of the metal layer 316 and photoresist 318, illustrated in FIGS. 3C and 3D, respectively. Therefore, the deposition trench 312 is detectable due to its topography, and its detection accuracy is reliable due to its reduced and predictable deterioration by the CMP slurry. As a result, the deposition trench 312 provides a reliable alignment mark for the patterning of the photoresist layer 318.

In an alternative embodiment of the present invention, not illustrated in the figures, the MOCVDTiN layer may be deposited over the deposition trench following planarization of the wafer surface by CMP. In this embodiment, the MOCVDTiN serves to repair damage caused by slurry attack in the deposition trench during CMP. The MOCVD-TiN covers even a deteriorated trench in a predictable manner, providing a reproducible alignment mark with acceptable detection accuracy. Moreover, any shift in the alignment mark may be corrected for in the photolithographic process, as long as it is reproducible. In addition, this embodiment may also provide an additional advantage of improving detectability over alignment marks produced through the use of MOCVDTiN as a protective layer. This is because the repair layer of MOCVDTiN provides full step coverage of the wafer surface, including the deposition trench. Therefore, the full trench depth is maintained following CMP processing, facilitating detection.

Figure 4:
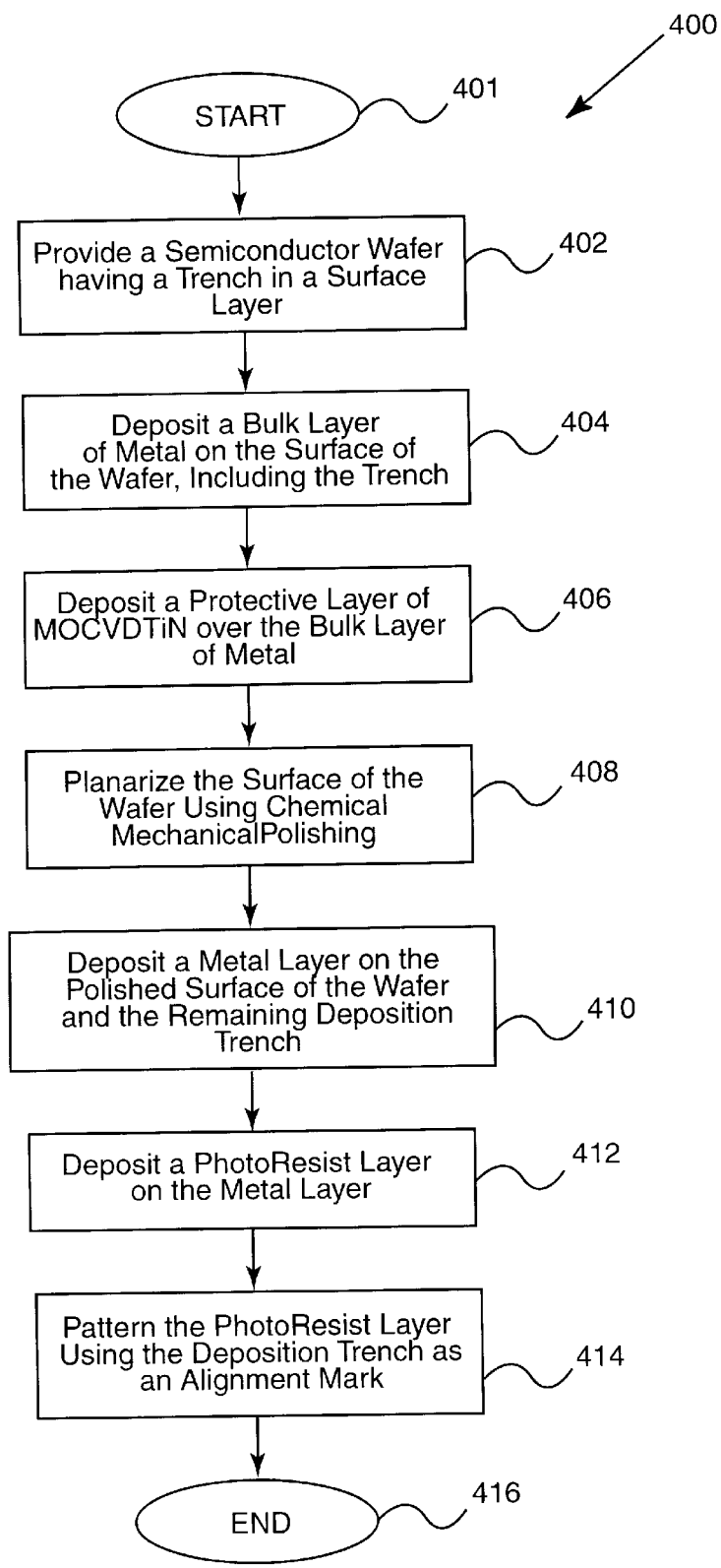
FIGS. 4 depicts a flow chart showing the steps of a method of creating a topographical alignment mark for use with CMP processing, according to a preferred embodiment of the present invention.

FIG. 4 shows a flow chart 400 of a preferred method of forming an alignment mark on a semiconductor wafer. The method 400 begins at 401, and at a step 402 a semiconductor wafer having a trench in a surface layer is provided. For example, the trench may be etched in a surface dielectric layer on the wafer. At a step 404, a layer of metal, for example bulk tungsten, is deposited on the surface of the wafer, including the trench, forming a deposition trench substantially following the contours of the original trench. Where the metal is tungsten, deposition of a bulk layer may be preceded by a nucleation layer of tungsten to provide a good base for the bulk layer.

At a step 406, a protective layer of MOCVDTiN is deposited over the bulk tungsten layer. Next, at a step 408, the surface of the wafer is planarized using chemical mechanical polishing. Due to its slurry-resistant properties, the MOCVDTiN is not substantially deteriorated by CMP slurry accumulating in the deposition trench during CMP processing. As a result, it substantially retains its symmetric profile. Alternatively, the MOCVDTiN layer may be deposited following CMP processing in order to repair damage caused to the deposition trench by slurry attack. Accordingly, steps 406 and 408 of the process flow 400 may be reversed.

At a step 410, a metal layer, for example AlCu, is deposited on the polished surface of the wafer, including the deposition trench. Then, at a step 412, a layer of photoresist is deposited on the metal layer. When, at a step 414, the photoresist layer is patterned, the deposition trench serves as a reliable alignment mark. The process ends at 416.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. An alignment mark on a semiconductor wafer, comprising:
   a trench in an dielectric layer of a semiconductor wafer;
   a base layer of conformally deposited equiaxed grain tungsten lining said trench;
   a bulk layer of conformally deposited columnar grain tungsten covering said base layer; and
   a protective layer of conformally deposited metal organic chemical vapor deposition titanium nitride covering said bulk layer;
   wherein a deposition trench providing a reliable alignment mark is formed by said tungsten and titanium nitride layers following planarization of the wafer's surface by chemical mechanical polishing.

2. The alignment mark of claim 1 wherein said protective layer is between about 50 and 300 Å thick.

3. The alignment mark of claim 2 wherein said protective layer is between about 50 and 250 Å thick.

4. The alignment mark of claim 3 wherein said protective layer is about 150 Å thick.

5. The alignment mark of claim 1 further comprising a metal layer and a photoresist layer deposited following chemical mechanical polishing of said wafer's surface, wherein a deposition trench providing a reliable alignment mark is formed by said tungsten, titanium nitride, metal and photoresist layers.

\* \* \* \* \*